United States Patent
Isaacson (10) Patent No.: US 8,860,209 B1
(45) Date of Patent: Oct. 14, 2014

(54) LED LUMINAIRE HAVING FRONT AND REAR CONVECTIVE HEAT SINKS

(75) Inventor: Chris Isaacson, Encinitas, CA (US)

(73) Assignee: NuLEDs, Inc., Vista, CA (US)

( * ) Notice: Subject to any disclaimer, the term of this patent is extended or adjusted under 35 U.S.C. 154(b) by 192 days.

(21) Appl. No.: 13/209,392

(22) Filed: Aug. 13, 2011

Related U.S. Application Data (60) Provisional application No. 61/374,238, filed on Aug. 16, 2010.

(51) Int. Cl.
*H01L 23/373* (2006.01)

(52) U.S. Cl.
USPC .... 257/712; 257/713; 257/722; 257/E23.106; 257/E23.109

(58) Field of Classification Search
USPC ........... 257/712, 713, 722, E23.106, E23.109
See application file for complete search history.

(56) References Cited

U.S. PATENT DOCUMENTS

| | | | |
|---|---|---|---|
| 3,911,327 A | 10/1975 | Murari et al. | |
| 5,065,279 A | 11/1991 | Lazenby et al. | |
| 6,603,665 B1 | 8/2003 | Truong et al. | |
| 6,964,499 B2 | 11/2005 | Colip et al. | |
| 7,198,386 B2 | 4/2007 | Zampini et al. | |
| 7,498,610 B2 | 3/2009 | Kim et al. | |
| 8,066,404 B2 * | 11/2011 | Song et al. | 362/219 |
| 8,100,558 B2 * | 1/2012 | Tseng et al. | 362/249.02 |
| 8,128,263 B2 * | 3/2012 | Higuchi et al. | 362/373 |
| 8,491,163 B2 * | 7/2013 | Higuchi et al. | 362/294 |
| 2004/0075100 A1 | 4/2004 | Bogner et al. | |
| 2007/0041190 A1 * | 2/2007 | Chou | 362/252 |
| 2009/0085047 A1 | 4/2009 | Livesay et al. | |
| 2010/0097797 A1 * | 4/2010 | Chen et al. | 362/234 |
| 2011/0254554 A1 * | 10/2011 | Harbers | 324/414 |
| 2011/0267822 A1 * | 11/2011 | Harbers et al. | 362/249.03 |
| 2012/0002419 A1 * | 1/2012 | Zaderej et al. | 362/249.02 |
| 2012/0008331 A1 * | 1/2012 | Marquardt et al. | 362/373 |
| 2012/0268933 A1 * | 10/2012 | Wegner | 362/235 |
| 2013/0021808 A1 * | 1/2013 | Harbers et al. | 362/418 |

* cited by examiner

*Primary Examiner* — Victor A Mandala
(74) *Attorney, Agent, or Firm* — Robroy R. Fawcett (57) ABSTRACT

Disclosed is a luminaire, comprising a front convective heat sink, a rear convective heat sink, and a removable thin printed circuit board. The front convective heat sink has at least one optical aperture. The removable thin printed circuit board has an electrically-insulated back surface and a selectively electrically-insulated front surface. The front surface has exposed electrical contacts in at least one area corresponding to the at least one optical aperture. The removable thin printed circuit board is sandwiched between the front and rear convective heat sinks with a compressive force.

19 Claims, 8 Drawing Sheets

LED LUMINAIRE HAVING FRONT AND REAR CONVECTIVE HEAT SINKS

CROSS-REFERENCE TO RELATED APPLICATION

This application claims the benefit of U.S. Provisional Application No. 61/374,238, filed Aug. 16, 2010, which application is incorporated herein by reference.

BACKGROUND OF THE INVENTION

1. Field of the Invention

The present invention relates to luminaires, for light-emitting diode (LED) illumination, having efficient thermal dissipation.

2. Description of the Prior Art and Related Information

Commercial spaces often employ track lighting to highlight products or informational displays. Such track lighting often employs halogen lamps. Halogen track lighting is relatively inefficient in the conversion of electricity into useable light expressed in lumens per watt.

Further, approximately 180 million halogen lamps from commercial usage are disposed of annually. Manufacturing these halogen lamps uses approximately 25,000 tons of natural resources, including various metals, glass, and plastics, which end up being deposited in landfills.

Also, halogen lamps generate significant radiated heat which may result in higher air conditioning costs, and discomfort by customers, employees, and visitors.

There is, therefore, a need for an improved luminaire for efficient illumination.

SUMMARY OF THE INVENTION

The present invention may be embodied in a luminaire, comprising a front convective heat sink, a rear convective heat sink, and a removable thin printed circuit board. The front convective heat sink has at least one optical aperture. The removable thin printed circuit board has an electrically-insulated back surface and a selectively electrically-insulated front surface. The front surface has exposed electrical contacts in at least one area corresponding to the at least one optical aperture. The removable thin printed circuit board is sandwiched between the front and rear convective heat sinks with a compressive force.

In more detailed features of the invention, the removable thin printed circuit board may be a flexible printed circuit board, and may have at least one light emitting diode coupled to the exposed electrical contacts. Further, the removable thin printed circuit board may have a solder mask layer on the front surface, a front copper layer comprising the exposed electrical contacts, an electrically insulative polyimide layer, a rear copper layer, and a solder mask layer on the back surface. The front copper layer may include at least one thermal contact for thermally coupling to a light emitting diode. The rear copper layer may have an area substantially equal to an area of the electrically-insulated back surface. Each of the front and rear copper layers comprise 3 ounce per square foot copper. Alternatively, the removable thin printed circuit board may have a solder mask layer on the front surface, a front copper layer comprising the exposed electrical contacts, an electrically insulative polyimide layer, a rear aluminum layer on the back surface.

In other more detailed features of the invention, the optical aperture may comprise a mirrored well in the front convective heat sink. The exposed electrical contacts are not in electrical contact with the front convective heat sink or with the back convective heat sink.

In other more detailed features of the invention, the front convective heat sink may have four optical apertures, the removable thin printed circuit board may have four areas corresponding to the four apertures, and four light emitting diodes may be mounted on the removable thin printed circuit board such that one light emitting diode is associated with each area corresponding to four optical apertures. Each light emitting diode may emit at least 60 lumens of visible light using an electrical input of 1.5 watts. The area of the electrically insulated back surface may be about 4 square inches.

The present invention also may be embodied in an assembly including a frame having a plurality of luminaires as defined in the present invention, means for pointing the frame with pan, tilt and roll adjustments, and means for directing a beam from each respective luminaire to have an adjustable beam spread.

BRIEF DESCRIPTION OF THE DRAWINGS

The accompanying drawings illustrate embodiments of the present invention and, together with the description, serve to explain the principles of the invention.

DETAILED DESCRIPTION

Figure 1:
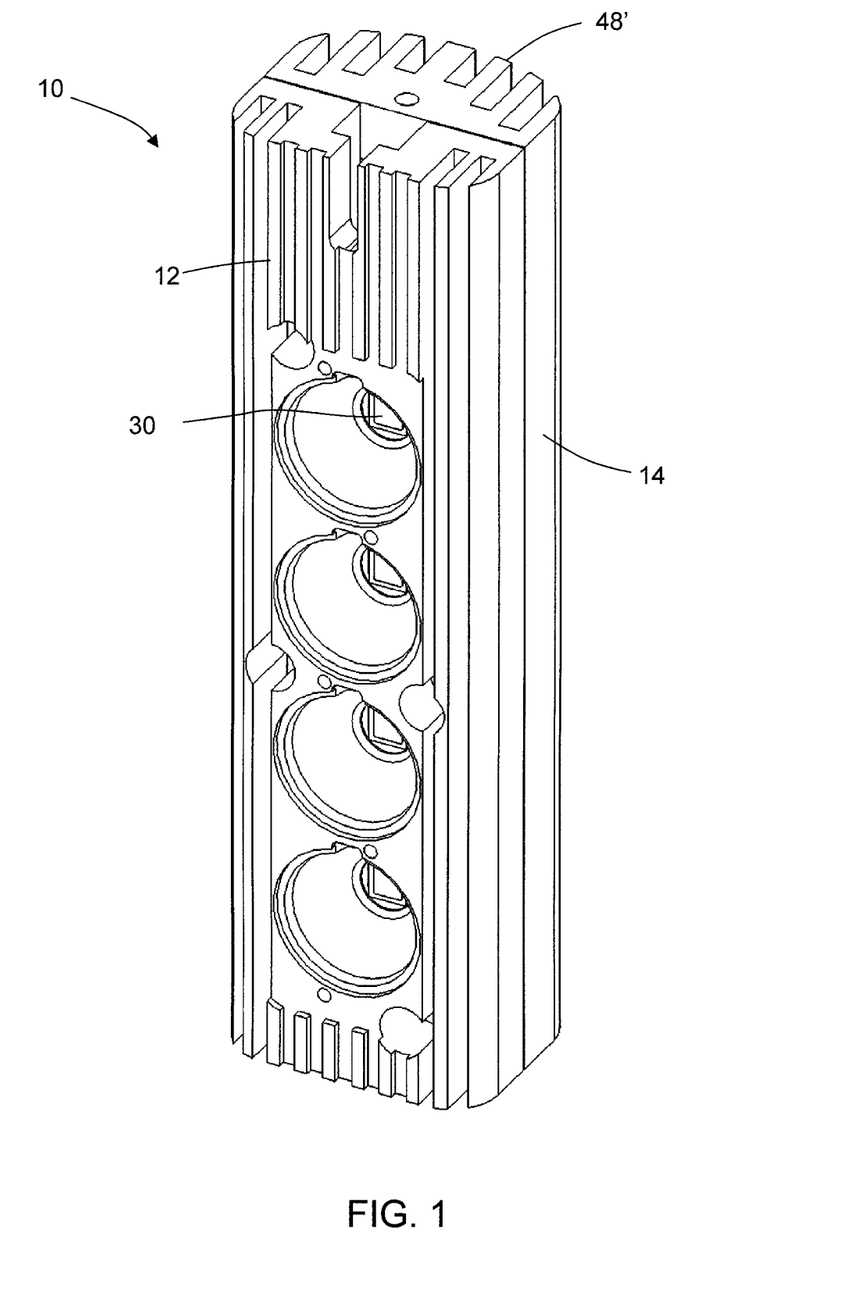
FIG. 1 is a perspective view of a first embodiment of a luminaire having front and rear convective heat sinks, according to the present invention.
Figure 2:
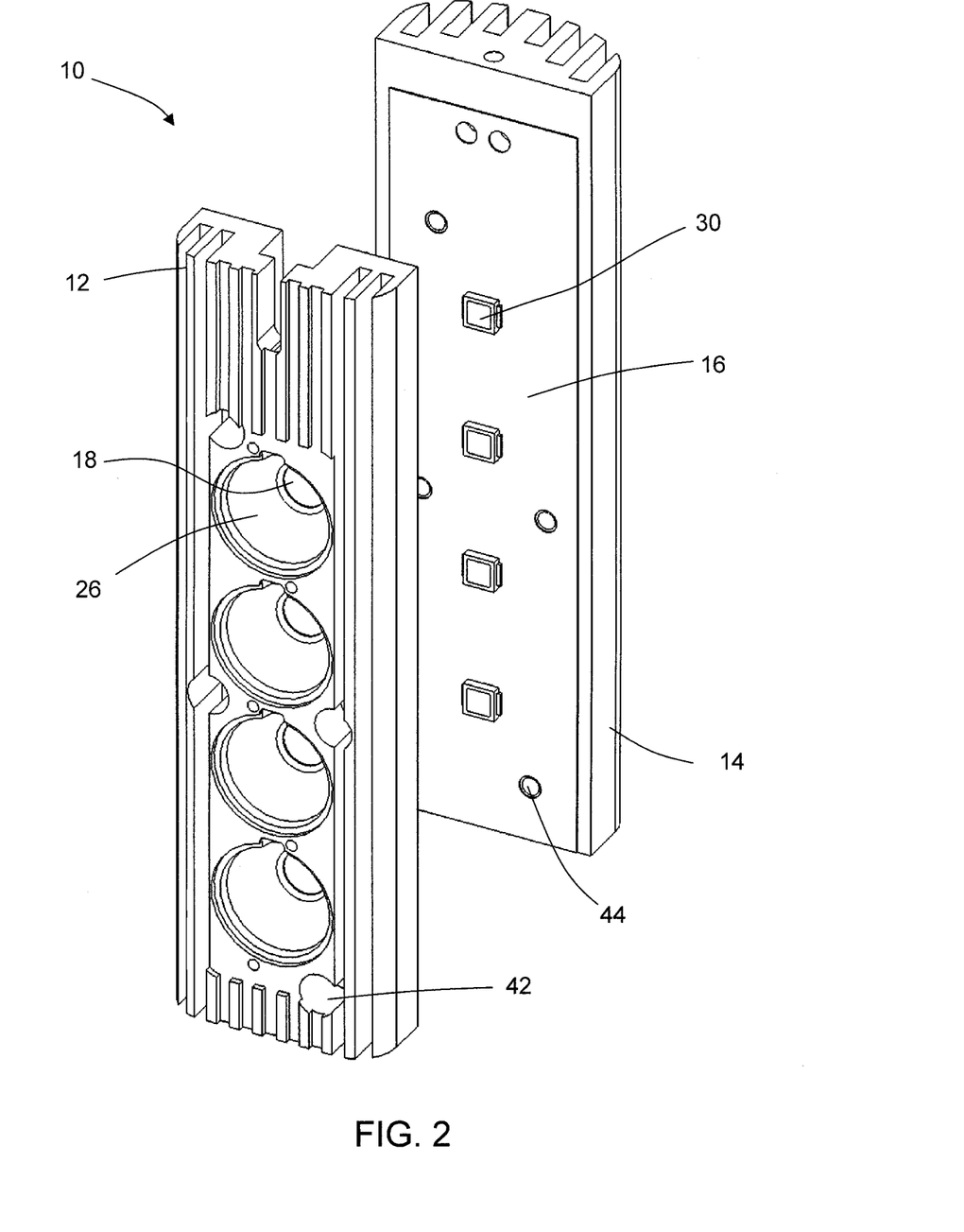
FIG. 2 is an exploded perspective view of luminaire having front and rear convective heat sinks, according to the present invention.
Figure 3:
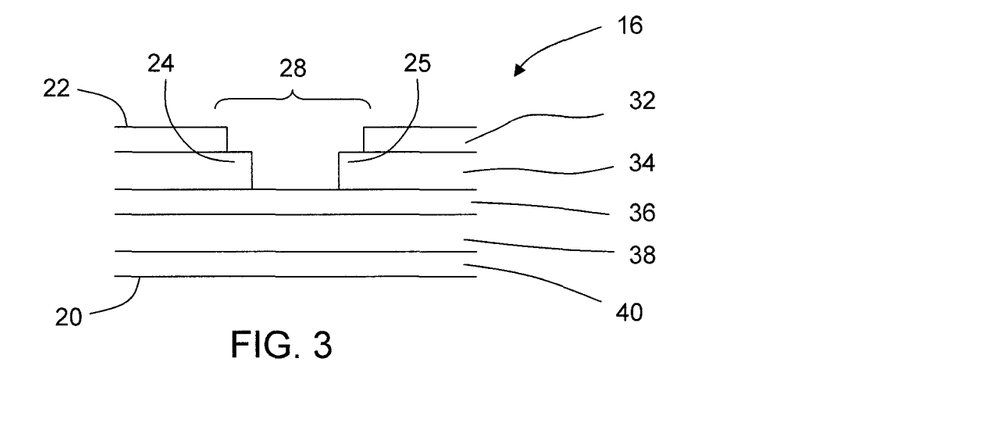
FIG. 3 is a cross-sectional view of a first embodiment of a removable thin printed circuit board, according to the present invention.

With reference to FIGS. 1-3, the present invention may be embodied in a luminaire 10, comprising a front convective heat sink 12, a rear convective heat sink 14, and a removable thin printed circuit board 16. The front convective heat sink has at least one optical aperture 18. The removable thin printed circuit board has an electrically-insulated back surface 20 and a selectively electrically-insulated front surface 22. The front surface has exposed electrical contacts, 24 and 25, in at least one area 28 corresponding to the at least one optical aperture 18. The removable thin printed circuit board 16 is sandwiched between the front and rear convective heat sinks, 12 and 14, with a compressive force. The compressive force maximizes the conductive thermal coupling between the removable thin printed circuit board and the heat sinks The removable thin printed circuit board 16 may be a flexible printed circuit board, and may have at least one light emitting diode 30 coupled to the exposed electrical contacts, 24 and 25. The removable thin printed circuit board may have a solder mask layer 32 on the front surface 22, a front copper layer 34 comprising the exposed electrical contacts, an electrically insulative polyimide layer 36, a rear copper layer 38, and a solder mask layer 40 on the back surface 20. The rear copper layer may have an area substantially equal to an area of the electrically-insulated back surface. Each of the front and rear copper layers comprise 3 ounce per square foot copper (about 107 microns thick).

The optical aperture 18 may comprise a mirrored well 26 in the front convective heat sink 12. Also, the optical aperture 18 and the well 26 may accommodate and align a molded refractive optic (not shown). The exposed electrical contacts, 24 and 25, are not in electrical contact with the front convective heat sink 12 or with the back convective heat sink 14.

The front and rear convective heat sinks, 12 and 14, may be held together by screws (not shown) located in screw holes, 42 and 44, in the front and rear convective heat sinks, respectively. The screws are tightened to apply the compressive force on the removable thin printed circuit board 16. The removable thin printed circuit board may be readily replaced or serviced by removing the screws to separate the front and rear heat sinks The thin printed circuit board 16 may have a quick-disconnect electrical connector or coupling (not shown) for easy removal and/or replacement. A spring loaded quick-release clamp may also be employed.

The front convective heat sink 12 may have four optical apertures 18, the removable thin printed circuit board 16 may have four areas 28 corresponding to the four apertures, and four light emitting diodes 30 may be mounted on the removable thin printed circuit board such that one light emitting diode (LED) is associated with each area corresponding to four optical apertures. Each light emitting diode emits at least 60 lumens of visible light using an electrical input of 1.5 watts. The area of the electrically insulated back surface 20 may be about 4 square inches.

Figure 4:
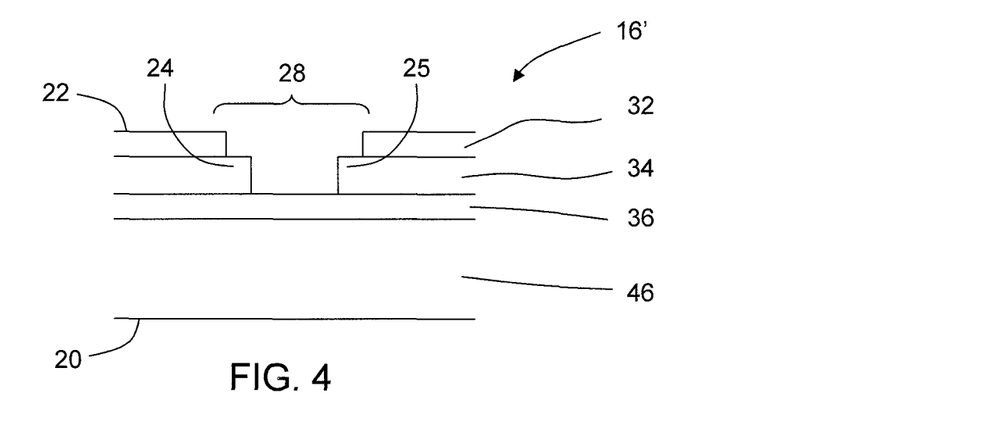
FIG. 4 is a cross-sectional view of a second embodiment of a removable thin printed circuit board, according to the present invention.

With reference to FIG. 4, in an alternative embodiment the removable thin printed circuit board 16' may have a solder mask layer 32 on the front surface 22, a front copper layer 34 comprising the exposed electrical contacts, 24 and 25, an electrically insulative polyimide layer 36, and a rear aluminum layer 46 on the back surface 20.

Figure 5:
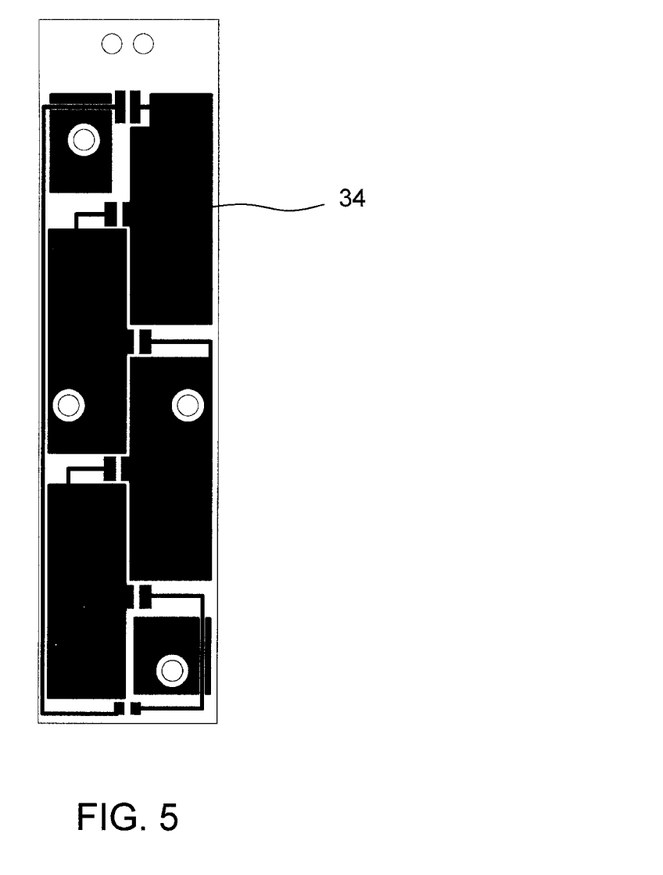
FIG. 5 is a layout of a first embodiment of a front copper layer.

With reference to FIG. 5, the front copper layer 34 may have a layout that provides a serial electrical conduction or circuit path through the four LEDs 30. Also, a bias resistor (not shown) may be serially coupled in the circuit path. The copper covers most of area of the first layer 34 to promote lateral thermal spreading to effectively transfer heat through thermal conduction paths to the front and back convective heat sinks, 12 and 14, through the solder mask layers, 32 and 40, the polyimide layer 36 and the second copper layer 38 (or the rear aluminum layer 46). The second copper layer also promotes lateral thermal spreading of heat away from the LEDs.

Figure 6:
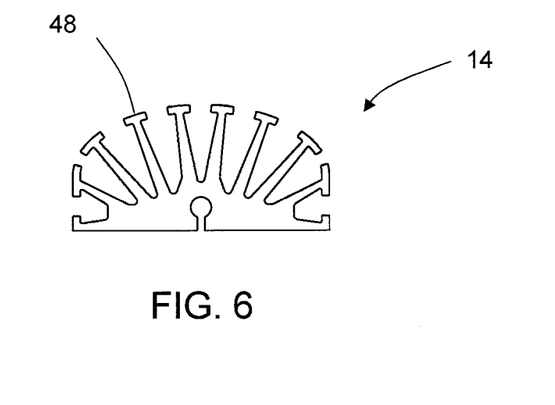
FIG. 6 is an end view of a rear convective heat sink.
Figure 7:
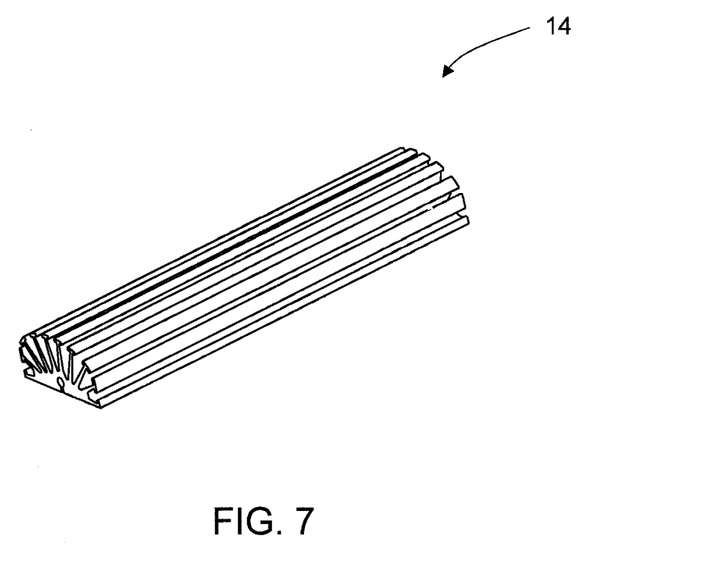
FIG. 7 is a perspective view of a rear convective heat sink.

With reference to FIGS. 6 and 7, the fins 48 on the back convective heat sink 14 may have a variety of shapes for effective convective removal of heat from the heat sink. The fins 48 shown in FIGS. 6 and 7 have a surface area maximizing T-shape whereas the fins 48' in FIGS. 1 and 2 have a more squared shape.

Figure 8:
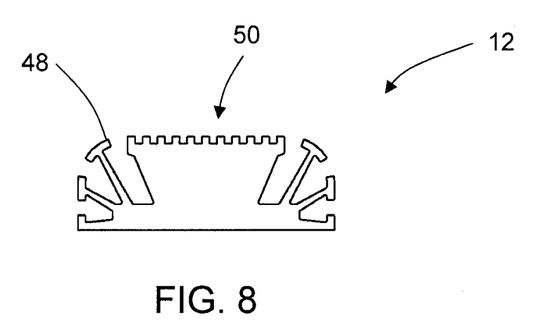
FIG. 8 is an end view of a front convective heat sink.

With reference to FIG. 8, similarly the fins 48 on the front convective heat sink 12 may have a variety of shapes for effective convective removal of heat from the heat sink. The fins 48 shown in FIG. 8 have a surface area maximizing T-shape. The front convective heat sink 12 may include a relatively flat surface 50 with fins that are less pronounced. Advantageously, the apertures 18 may be located through the relatively flat surface 50.

Figure 9:
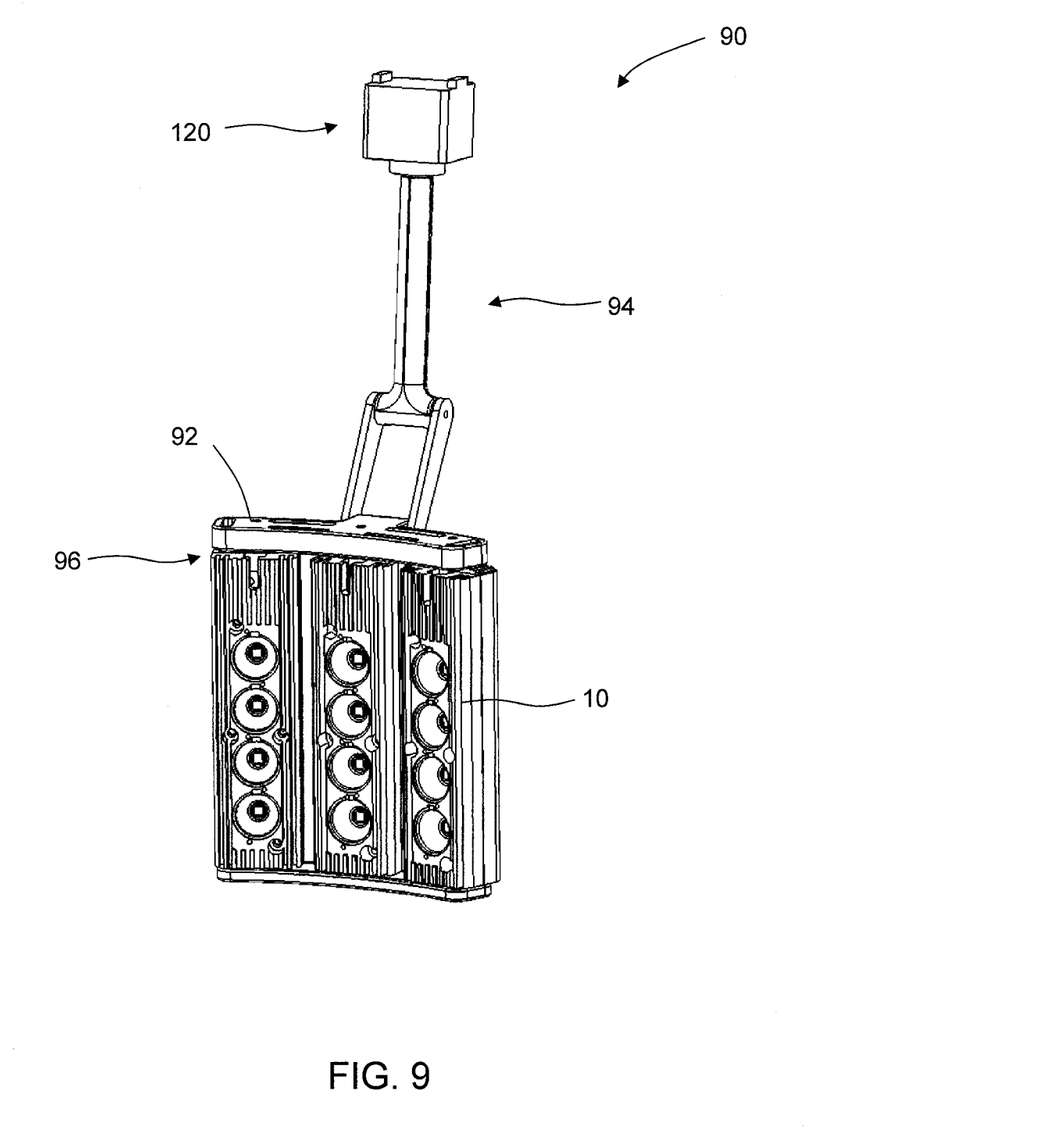
FIG. 9 is a perspective view of a luminaire assembly, according to the present invention.

With reference to FIG. 9, an assembly 90 may include a frame 92 having a plurality of luminaires 10 (as defined in the present invention), means 94 for pointing the frame with pan, tilt and roll adjustments, and means 96 for directing a beam from each respective luminaire to have an adjustable beam spread for flood lighting applications.

Figure 10:
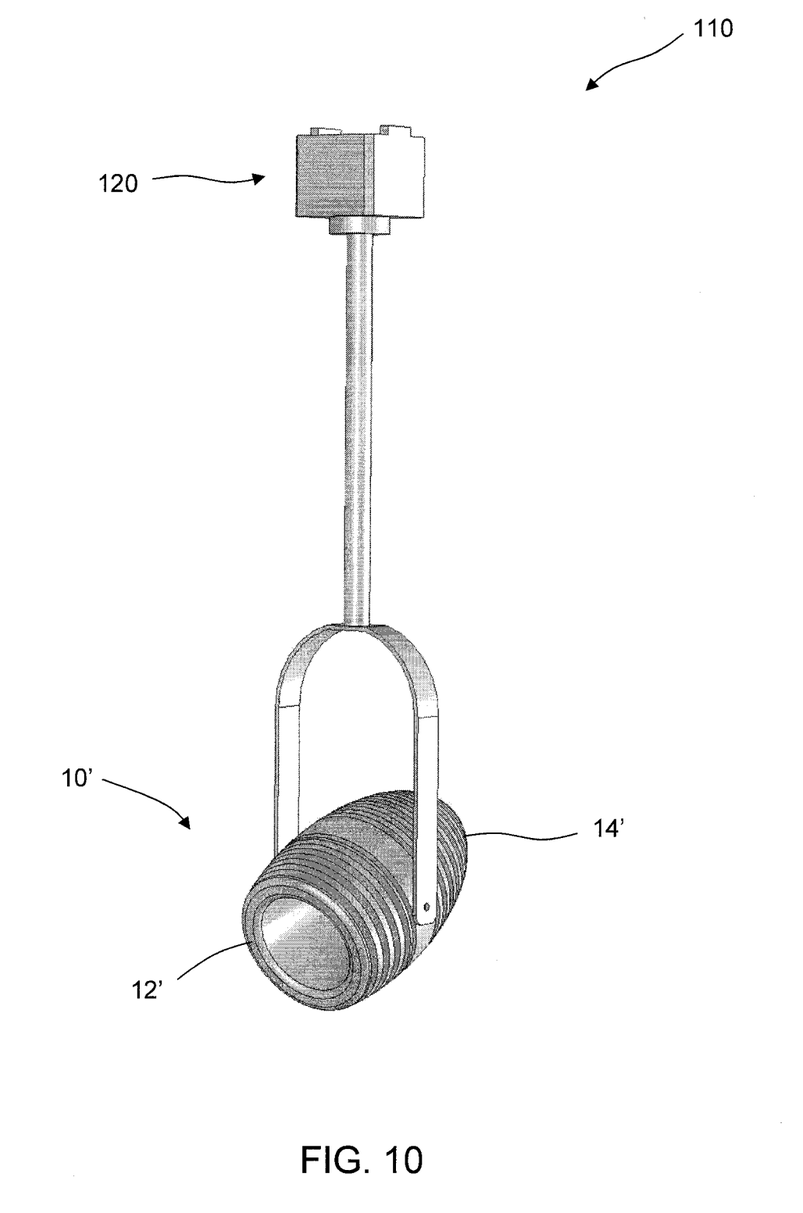
FIG. 10 is a perspective view of a luminaire assembly having a round luminaire, according to the present invention.
Figure 11:
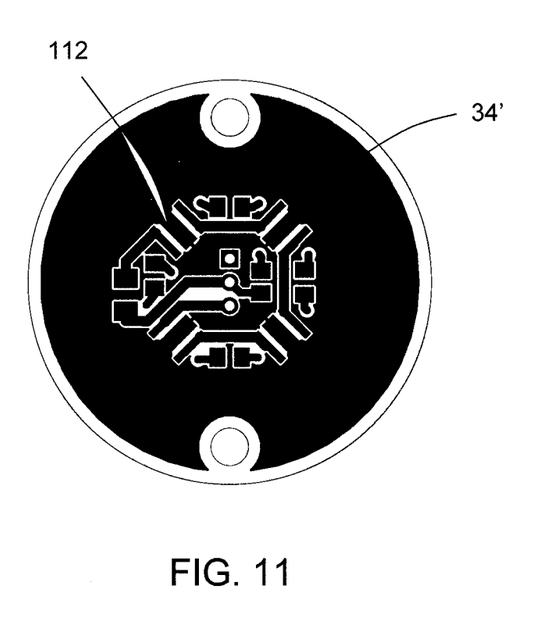
FIG. 11 is a layout of a front copper layer for the round luminaire of FIG. 10.

With reference to FIGS. 10 and 11, the front and rear convective heat sink, 12' and 14', of the luminaire 10' may have a rounded shape with at least one optical aperture in the front convective heatsink. The rounded luminare likewise may be incorporated into an assembly 110 having pan and tilt rotation. A corresponding front copper layer 34' may include at least one thermal contact for thermally coupling to a light emitting diode. The thermal contact 112 may be electrically isolated from the contacts, 24 and 25, which are electrically coupled to each LED. The circular LED array may be recessed in an ellipsoid housing for spot applications.

The assemblies, 90 and 110, may include a mono-point socket 120 for power, and for attachment to a lighting track.

The heat sinks, 12 and 14, may form a long cylinder with many LEDs 30 for cove lighting, refrigerator case lighting, under-cabinet lighting, display case lighting, and the like.

A conductive thermal path between the first and second convective heat sinks, 12 and 14, allows effective use of the heat sinking capabilities of both heat sinks Thus, by using dual or parallel thermal paths to the heat sinks through the front surface 22 and through the back surface 20 of the printed circuit board 16, the equivalent thermal resistance to ambient may be significantly reduced. The heat sinks may be optimized for maximum natural convection, with one heat sink having at least one optical aperture 18. Also, the relatively thick and large surface areas on the front copper layer, thermally connected to the thermal junction of the LED (often the LED cathode), along with a relatively thick second copper layer 38 (or thermal conduction layer 46) that is electrically isolated, permits efficient heat transfer through a very thin printed circuit board 16.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A luminaire, comprising:
   a front convective heat sink having at least one optical aperture;
   a rear convective heat sink; and
   a removable thin printed circuit board having an electrically-insulated back surface and a selectively electrically-insulated front surface having exposed electrical contacts in at least one area corresponding to the at least one optical aperture;
   wherein the removable thin printed circuit board has a solder mask layer on the front surface, a front copper layer comprising the exposed electrical contacts, an electrically insulative polyimide layer, a rear copper layer, and a solder mask layer on the back surface; and
   wherein the removable thin printed circuit board is sandwiched between the front and rear convective heat sinks with a compressive force.

2. A luminaire as defined in claim 1, wherein the removable thin printed circuit board is a flexible printed circuit board.

3. A luminaire as defined in claim 1, wherein the removable thin printed circuit board has at least one light emitting diode coupled to the exposed electrical contacts.

4. A luminaire as defined in claim 1, wherein the front copper layer comprising at least one thermal contact for thermally coupling to a light emitting diode.

5. A luminaire as defined in claim 1, wherein the rear copper layer has an area substantially equal to an area of the electrically-insulated back surface.

6. A luminaire as defined in claim 1, wherein each of the front and rear copper layers comprise 3 ounce per square foot copper.

7. A luminaire as defined in claim 1, wherein the optical aperture comprises a mirrored well in the front convective heat sink.

8. A luminaire as defined in claim 1, wherein the exposed electrical contacts are not in electrical contact with the front convective heat sink or with the back convective heat sink.

9. A luminaire as defined in claim 1, wherein:
the front convective heat sink has four optical apertures;
the removable thin printed circuit board has four areas corresponding to the four apertures; and
four light emitting diodes are mounted on the removable thin printed circuit board such that one light emitting diode is associated with each area corresponding to four optical apertures.

10. A luminaire as defined in claim 9, wherein each light emitting diode emits at least 60 lumens of visible light using an electrical input of 1.5 watts.

11. A luminaire as defined in claim 9, wherein the area of the insulated back surface comprises about 4 square inches.

12. An assembly comprising:
a frame having a plurality of luminaires as defined in claim 1;
means for pointing the frame with pan, tilt and roll adjustments; and
means for directing a beam from each respective luminaire to have an adjustable beam spread.

13. A luminaire, comprising:
a front convective heat sink having at least one optical aperture;
a rear convective heat sink; and
a removable thin printed circuit board having an electrically-insulated back surface and a selectively electrically-insulated front surface having exposed electrical contacts in at least one area corresponding to the at least one optical aperture;
wherein the removable thin printed circuit board has a solder mask layer on the front surface, a front copper layer comprising the exposed electrical contacts, an electrically insulative polyimide layer, a rear aluminum layer, and a solder mask layer on the back surface; and
wherein the removable thin printed circuit board is sandwiched between the front and rear convective heat sinks with a compressive force.

14. A luminaire, comprising:
a front convective heat sink having at least one optical aperture;
a rear convective heat sink; and
a removable thin printed circuit board having a back surface and a selectively electrically-insulated front surface having exposed electrical contacts in at least one area corresponding to the at least one optical aperture, the removable thin printed circuit board further having:
a front mask layer on electrically insulated areas of the front surface,
a front conduction layer comprising the exposed electrical contacts,
a rear conduction layer, and
an electrically insulative center layer between the front conduction layer and the rear conduction layer;
wherein the removable thin printed circuit board is sandwiched between the front and rear convective heat sinks with a compressive force.

15. A luminaire as defined in claim 14, wherein the front conduction layer comprises copper.

16. A luminaire as defined in claim 14, wherein the rear conduction layer comprises aluminum.

17. A luminaire as defined in claim 14, wherein the rear conduction layer comprises copper.

18. A luminaire as defined in claim 14, wherein the back surface of the removable thin printed circuit board is electrically-insulated.

19. A luminaire as defined in claim 14, wherein
the front mask layer is a solder mask layer;
the removable thin printed circuit board has a an electrically insulative solder mask layer on is the back surface; and
the electrically insulative center layer is a polyimide layer.

* * * * *